US 12,051,710 B2

(12) United States Patent
Wakabayashi et al.

(10) Patent No.: US 12,051,710 B2
(45) Date of Patent: Jul. 30, 2024

(54) IMAGING DEVICE

(71) Applicant: Panasonic Intellectual Property Management Co., Ltd., Osaka (JP)

(72) Inventors: Daisuke Wakabayashi, Osaka (JP); Yuuko Tomekawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 195 days.

(21) Appl. No.: 17/705,226

(22) Filed: Mar. 25, 2022

(65) Prior Publication Data

US 2022/0216259 A1 Jul. 7, 2022

Related U.S. Application Data

(63) Continuation of application No. PCT/JP2020/035649, filed on Sep. 18, 2020.

(30) Foreign Application Priority Data

Oct. 28, 2019 (JP) ................. 2019-195650

(51) Int. Cl.
*H01L 27/146* (2006.01)
*H04N 5/3745* (2011.01)
*H04N 25/77* (2023.01)

(52) U.S. Cl.
CPC .. *H01L 27/14623* (2013.01); *H01L 27/14612* (2013.01); *H01L 27/14636* (2013.01); *H04N 25/77* (2023.01)

(58) Field of Classification Search
CPC ............ H01L 27/146; H01L 27/14601; H01L 27/14603; H01L 27/14605;

(Continued)

(56) References Cited

U.S. PATENT DOCUMENTS 8,736,731 B2 * 5/2014 Noudo ................ H01L 27/1464
348/340
2009/0072336 A1 * 3/2009 Kitano .............. H01L 27/14806
257/E31.119

(Continued)

FOREIGN PATENT DOCUMENTS

JP 2005-328068 11/2005
JP 2006-032714 2/2006

(Continued)

OTHER PUBLICATIONS

International Search Report of PCT application No. PCT/JP2020/035649 dated Nov. 10, 2020.

*Primary Examiner* — John R Lee
(74) *Attorney, Agent, or Firm* — Rimon P.C.

(57) ABSTRACT

An imaging device includes a pixel section and a peripheral circuitry section provided around the pixel section. The pixel section includes: a photoelectric conversion film; a top electrode located above the photoelectric conversion film; bottom electrodes that face the top electrode, with the photoelectric conversion film being disposed between the top electrode and the bottom electrodes; and a first light-shielding film that overlaps part of the photoelectric conversion film in a plan view and that is electrically connected to the top electrode. The first light-shielding film has electrical conductivity. The peripheral circuitry section includes peripheral circuitry and a second light-shielding film that overlaps at least part of the peripheral circuitry in the plan view. The first light-shielding film and the second light-shielding film are separated from each other.

22 Claims, 9 Drawing Sheets

(58) Field of Classification Search
CPC .......... H01L 27/14609; H01L 27/1461; H01L 27/14612; H01L 27/1462; H01L 27/14623; H01L 27/14636; H01L 27/1463; H04N 25/77; H04N 25/772; H04N 25/76

See application file for complete search history.

(56) References Cited

U.S. PATENT DOCUMENTS

| | | | |
|---|---|---|---|
| 2012/0086094 A1* | 4/2012 | Watanabe | H01L 27/1464 257/E31.127 |
| 2012/0242874 A1 | 9/2012 | Noudo | |
| 2012/0326257 A1* | 12/2012 | Takata | H10K 39/32 257/432 |
| 2015/0179693 A1* | 6/2015 | Maruyama | H01L 27/14687 438/66 |
| 2015/0194469 A1 | 7/2015 | Joei | |
| 2016/0037107 A1 | 2/2016 | Sakaguchi | |
| 2016/0133865 A1* | 5/2016 | Yamaguchi | H04N 25/76 257/40 |
| 2018/0020171 A1 | 1/2018 | Miyake et al. | |
| 2020/0119099 A1 | 4/2020 | Shibuta | |
| 2020/0124749 A1* | 4/2020 | Takenaka | G01T 1/20183 |
| 2020/0227455 A1* | 7/2020 | Lee | H01L 27/1463 |
| 2022/0190014 A1* | 6/2022 | Matsuo | H10K 19/00 |
| 2022/0216259 A1* | 7/2022 | Wakabayashi | H01L 27/14612 |
| 2023/0217103 A1* | 7/2023 | Hatano | H01L 27/14645 257/292 |

FOREIGN PATENT DOCUMENTS

| | | |
|---|---|---|
| JP | 2012-114197 | 6/2012 |
| JP | 2012-114838 | 6/2012 |
| JP | 2012-204390 | 10/2012 |
| JP | 2012-204449 | 10/2012 |
| JP | 2016-033980 | 3/2016 |
| JP | 2019-016667 | 1/2019 |
| WO | 2014/007132 | 1/2014 |
| WO | 2017/094229 | 6/2017 |

* cited by examiner

IMAGING DEVICE

BACKGROUND

1. Technical Field

The present disclosure relates to an imaging device.

2. Description of the Related Art

Image sensors each include photodetecting elements for generating electrical signals corresponding to the amounts of incident light and a plurality of pixels arranged one or two dimensionally. Of the image sensors, stacked image sensors refer to those having, as pixels, photodetecting elements having a structure in which a photoelectric conversion film is stacked on a substrate. Examples of the stacked image sensors are disclosed in Japanese Patent No. 4729275, Japanese Unexamined Patent Application Publication No. 2019-016667, Japanese Unexamined Patent Application Publication No. 2005-328068, and Japanese Patent No. 5735318.

SUMMARY

In one general aspect, the techniques disclosed here feature an imaging device including: a pixel section; and a peripheral circuitry section provided around the pixel section. The pixel section includes: a photoelectric conversion film; a top electrode located above the photoelectric conversion film; bottom electrodes that face the top electrode, with the photoelectric conversion film being disposed between the top electrode and the bottom electrodes; and a first light-shielding film that overlaps part of the photoelectric conversion film in a plan view and that is electrically connected to the top electrode. The first light-shielding film has electrical conductivity. The peripheral circuitry section includes peripheral circuitry and a second light-shielding film that overlaps at least part of the peripheral circuitry in the plan view. The first light-shielding film and the second light-shielding film are separated from each other.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
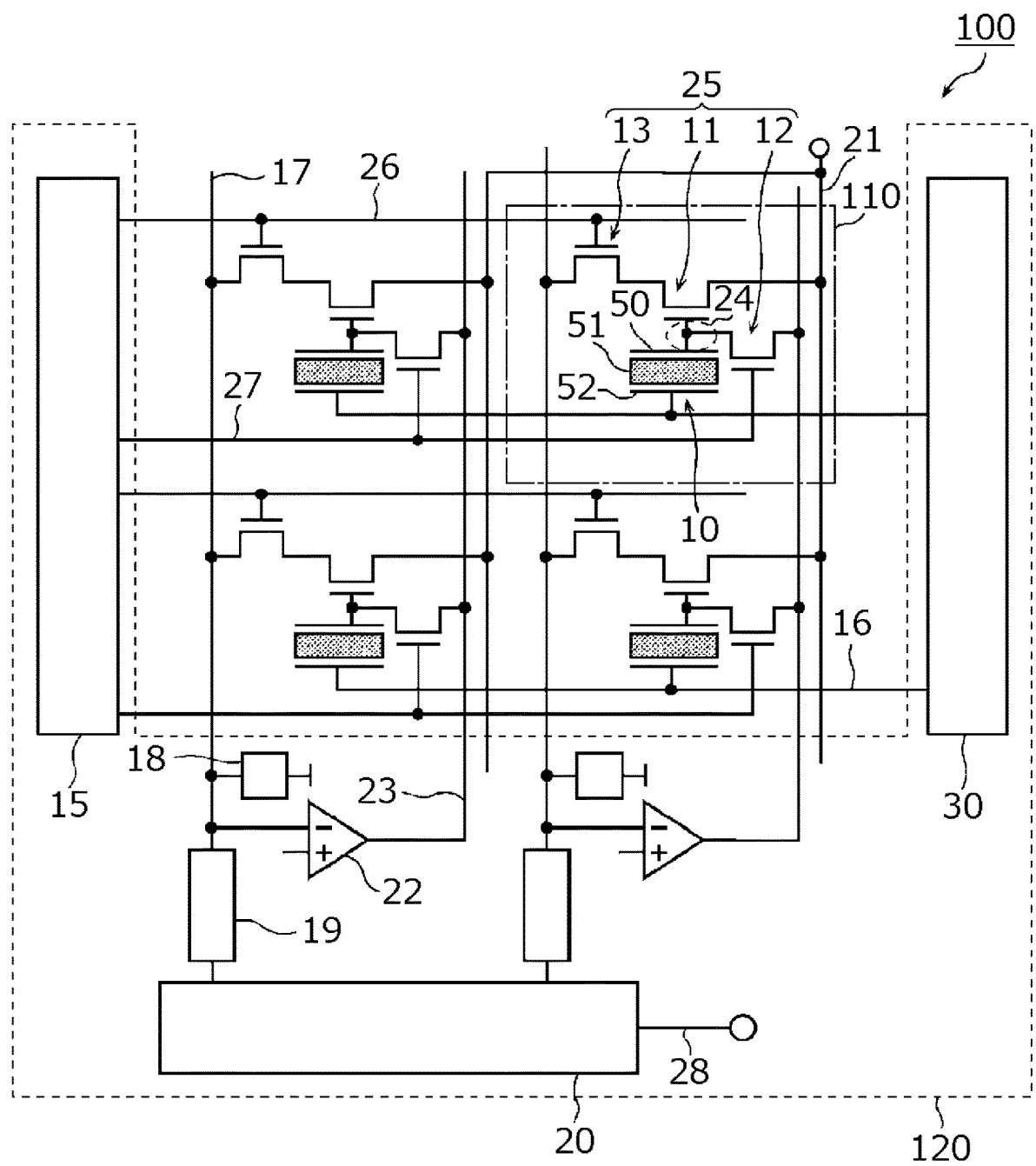
FIG. 1 is a schematic diagram of a circuit configuration of an imaging device according to a first embodiment.

Japanese Unexamined Patent Application Publication No. 2005-328068 discloses an array of photodetectors which has a structure in which a voltage is applied to a transparent electrode via a metal film formed so as to cover a side portion of a layer in which the photodetectors are formed. However, in the structure disclosed in Japanese Unexamined Patent Application Publication No. 2005-328068, when a control circuit is disposed at an outer periphery portion, the voltage applied to the transparent electrode can cause adverse effects on the control circuit. That is, in the related art, there is a problem in that the operation of the control circuit becomes unstable.

Accordingly, the present disclosure provides an imaging device in which circuit operations can be improved.

Overview of the Present Disclosure

An imaging device according to one aspect of the present disclosure includes: a pixel section; and a peripheral circuitry section provided around the pixel section. The pixel section includes: a photoelectric conversion film; a top electrode located above the photoelectric conversion film; bottom electrodes that face the top electrode, with the photoelectric conversion film being disposed between the top electrode and the bottom electrodes; and a first light-shielding film that overlaps part of the photoelectric conversion film in a plan view and that is electrically connected to the top electrode. The first light-shielding film has electrical conductivity. The peripheral circuitry section includes peripheral circuitry and a second light-shielding film that overlaps at least part of the peripheral circuitry in the plan view. The first light-shielding film and the second light-shielding film are separated from each other.

With this arrangement, the first light-shielding film, which is used to supply power to the top electrode, and the second light-shielding film, included in the peripheral circuitry section, are separated from each other. Thus, even when the potential of the first light-shielding film fluctuates, an influence that the fluctuation has on the second light-shielding film is sufficiently suppressed or reduced. Thus, the peripheral circuitry covered by the second light-shielding film can operate stably independently of the potential of the first light-shielding film. Thus, the imaging device according to this aspect makes it possible to stabilize the circuit operation.

Also, for example, the peripheral circuitry section may include: a spacer layer that includes the same material as material of the photoelectric conversion film and that overlaps at least part of the peripheral circuitry in the plan view; and the second light-shielding film may be located above the spacer layer.

This makes it possible to increase the distance between the second light-shielding film and the peripheral circuitry, and thus, even when the second light-shielding film has an electrical conductivity property, and the potential of the second light-shielding film fluctuates owing to some influence, it is possible to suppress or reduce an influence on the peripheral circuitry. Accordingly, it is possible to stabilize the circuit operation of the imaging device.

Also, for example, a thickness of the photoelectric conversion film and a thickness of the spacer layer may be the same.

With this arrangement, since the photoelectric conversion film and the spacer layer can be formed in the same processes, it is possible to simplify the manufacturing processes, for example, to reduce the number of processes required in manufacture of imaging devices. Since the manufacturing processes are simplified, it is possible to realize imaging devices with small variations in manufacture and with high reliability.

Also, for example, the peripheral circuitry section may further include an insulating layer located between the second light-shielding film and the spacer layer.

This makes it possible to ensure electrical insulation between the second light-shielding film and the spacer layer. Even when the potential of the second light-shielding film fluctuates, it is possible to suppress or reduce an influence that the fluctuation has on the peripheral circuitry. Accordingly, it is possible to stabilize the circuit operation of the imaging device.

Also, for example, the peripheral circuitry may include a sample-hold circuit; and in the plan view, the second light-shielding film may overlap the sample-hold circuit.

This allows the second light-shielding film to suppress or reduce light incidence on the sample-hold circuit, thus making it possible to suppress or reduce fluctuation of the amount of charge held by the sample-hold circuit. Accordingly, it is possible to suppress or reduce deterioration of the image quality of images generated by the imaging device.

Also, for example, the peripheral circuitry may include a sample-hold circuit; and in the plan view, the sample-hold circuit does not have to be disposed between the first light-shielding film and the second light-shielding film.

This allows the first light-shielding film or the second light-shielding film to suppress or reduce light incidence on the sample-hold circuit, thus making it possible to suppress or reduce fluctuation of the amount of charge held by the sample-hold circuit. Accordingly, it is possible to suppress or reduce deterioration of the image quality of images generated by the imaging device.

Also, for example, material of the first light-shielding film may be same as material of the second light-shielding film. The first light-shielding film and the second light-shielding film may be formed using the same material.

With this arrangement, since the first light-shielding film and the second light-shielding film can be formed in the same processes, it is possible to simplify the manufacturing processes, for example, to reduce the number of processes required in manufacture of imaging devices. Since the manufacturing processes are simplified, it is possible to realize imaging devices with small variations in manufacture and with high reliability.

Also, for example, the second light-shielding film may have electrical conductivity; and a constant voltage or a ground voltage may be applied to the second light-shielding film.

With this arrangement, since the potential of the second light-shielding film can be fixed to a predetermined value, it is possible to stably operate the peripheral circuitry covered by the second light-shielding film.

Also, for example, a variable voltage may be applied to the first light-shielding film.

With this arrangement, for example, since the value to which the potential of the second light-shielding film is fixed can be changed depending on the situation, it is possible to stably operate the peripheral circuitry covered by the second light-shielding film.

Also, for example, a thickness of the first light-shielding film and a thickness of the second light-shielding film may be the same.

With this arrangement, since the first light-shielding film and the second light-shielding film can be formed in the same processes, it is possible to simplify the manufacturing processes, for example, to reduce the number of processes required in manufacture of imaging devices. Since the manufacturing processes are simplified, it is possible to realize imaging devices with small variations in manufacture and with high reliability.

Also, for example, in the plan view, a transistor does not have to be disposed between the first light-shielding film and the second light-shielding film. In the plan view, the transistor may overlap at least one selected from the group consisting of the first light-shielding film and the second light-shielding film.

This allows the first light-shielding film and the second light-shielding film to suppress or reduce light incidence on the transistor, thus making it possible to suppress or reduce charge generation in the transistor. Accordingly, since it is possible to suppress or reduce the transistor operation becoming unstable, the operation of the imaging device can be stabilized.

Also, for example, the pixel section may further include an insulating layer located between the first light-shielding film and the top electrode.

This makes it possible to use the insulating layer as a protective layer of the top electrode.

For example, in the plan view, the first light-shielding film does not have to overlap the peripheral circuitry.

For example, in the plan view, the first light-shielding film does not have to overlap the second light-shielding film.

For example, in the plan view, the first light-shielding film may overlap one or more of the bottom electrodes.

For example, in the plan view, the peripheral circuitry does not have to overlap the top electrode.

For example, the top electrode may be a transparent electrode.

Embodiments will be described in detail below with reference to the accompanying drawings.

The embodiments described below each represent a general or specific example. Numerical values, shapes, materials, constituent elements, the arrangement positions and the connection forms of constituent elements, steps, the order of steps, and so on described in the embodiments below are examples and are not intended to limit the present disclosure. Also, of the constituent elements in the embodiments below, constituent elements not set forth in the independent claims will be described as optional constituent elements.

Also, the drawings are schematic diagrams and are not necessarily strictly illustrated. Accordingly, for example, scales and so on do not necessarily match in each drawing. In the individual drawings, substantially the same elements are denoted by the same reference numerals, and redundant descriptions are omitted or are briefly given.

Herein, the terms "same" and so on representing relationships between elements, terms "rectangular" and so on representing element shapes, and the ranges of numerical values are not expressions representing only exact meanings and are expressions representing substantially equivalent ranges, for example, expressions meaning that they include differences of about several percent.

Also, herein, the terms "above" and "below" do not refer to an upper direction (a vertically upper side) and a lower direction (a vertically lower side) in absolute spatial recognition and are used as terms defined by relative positional relationships based on the order of stacked layers in a stacked configuration. In addition, the terms "above" and "below" apply not only to cases in which a constituent element exists between two constituent elements arranged with a gap therebetween but also to cases in which two constituent elements are arranged to adhere to each other and contact each other.

First Embodiment

[Circuit Configuration of Imaging Device]

An overview of a circuit configuration of an imaging device according to a first embodiment will be described with reference to FIG. 1.

FIG. 1 is a schematic diagram illustrating a circuit configuration of an imaging device 100 according to the present embodiment. As illustrated in FIG. 1, the imaging device 100 includes a plurality of pixels 110 and peripheral circuitry 120.

The pixels 110 are arrayed at a semiconductor substrate two dimensionally, that is, in a row direction and a column direction, to form a pixel region. The pixels 110 may be arrayed in one line. That is, the imaging device 100 may be a line image sensor. Herein, the row direction and the column direction refer to directions in which a row and a column extend, respectively. Specifically, the column direction is a vertical direction, and the row direction is a horizontal direction.

Each pixel 110 includes a light detection portion 10 and a charge detection circuit 25. The light detection portion 10 includes a pixel electrode 50, a photoelectric conversion film 51, and a transparent electrode 52. A specific configuration of the light detection portion 10 is described later. The charge detection circuit 25 includes an amplifying transistor 11, a reset transistor 12, and an address transistor 13.

The imaging device 100 includes voltage control elements for applying a predetermined voltage to the transparent electrode 52. The voltage control elements include, for example, a voltage control circuit, a voltage generating circuit, such as a constant voltage supply, and a voltage reference line, such as a ground line. A voltage applied by the voltage control elements is referred to as a "control voltage". In the present embodiment, the imaging device 100 includes a voltage control circuit 30 as one of the voltage control elements.

The voltage control circuit 30 may cause a constant control voltage to be generated or may cause control voltages having different values to be generated. For example, the voltage control circuit 30 may cause control voltages having two or more different values to be generated or may cause a control voltage that varies continuously in a predetermined range to be generated. The voltage control circuit 30 determines a value of a control voltage to be generated, based on a command from an operator who operates the imaging device 100 or a command from another control unit included in the imaging device 100, and then generates the control voltage having the determined value. The voltage control circuit 30 is provided outside a photosensitive region as a portion of the peripheral circuitry 120. The photosensitive region is substantially the same as the pixel region.

In the present embodiment, as illustrated in FIG. 1, the voltage control circuit 30 applies the control voltage to the transparent electrode 52 in the pixels 110, arrayed in the row direction, via counter-electrode signal lines 16. By applying the control voltage, the voltage control circuit 30 changes voltages across the pixel electrodes 50 and the transparent electrode 52 to switch between spectral sensitivity characteristics of the light detection portions 10.

In order for electrons to be accumulated in each pixel electrode 50 as signal charge when the light detection portion 10 is illuminated with light, a potential of the pixel electrode 50 is set to a potential higher than that of the transparent electrode 52. In this case, since the direction of movement of electrons is opposite to the direction of movement of holes, electrical current flows from the pixel electrode 50 to the transparent electrode 52. Also, in order for holes to be accumulated in each pixel electrode 50 as signal charge when the light detection portion 10 is illuminated with light, the pixel the potential of the electrode 50 is set to a potential lower than that of the transparent electrode 52. In this case, electrical current flows from the transparent electrode 52 to the pixel electrode 50.

The pixel electrode 50 is connected to a gate electrode of the amplifying transistor 11, and signal charge collected by the pixel electrode 50 is accumulated in a charge accumulation node 24 located between the pixel electrode 50 and the gate electrode of the amplifying transistor 11. In the present embodiment, the signal charge is holes. Alternatively, the signal charge may be electrons.

The signal charge accumulated in the charge accumulation node 24 is applied to the gate electrode of the amplifying transistor 11 as a voltage corresponding to the amount of the signal charge. The amplifying transistor 11 is included in the charge detection circuit 25 and amplifies the voltage applied to the gate electrode. The address transistor 13 selectively reads out the amplified voltage as a signal voltage. The address transistor 13 is also called a row selecting transistor. One of a source electrode and a drain electrode of the reset transistor 12 is connected to the pixel electrode 50 to reset the signal charge accumulated in the charge accumulation node 24. In other words, the reset transistor 12 resets a potential of the gate electrode of the amplifying transistor 11 and the potential of the pixel electrode 50.

In order to selectively perform the above-described operation in the pixels 110, the imaging device 100 includes power-supply wires 21, vertical signal lines 17, address signal lines 26, and reset signal lines 27. These wires and signal lines are connected to the pixels 110. Specifically, each power-supply wire 21 is connected to one of a source electrode and a drain electrode of each of the corresponding amplifying transistors 11. The vertical signal line 17 is connected to one of a source electrode and a drain electrode of the address transistor 13, the other of the source electrode and the drain electrode thereof being connected to the amplifying transistor 11. Each address signal line 26 is connected to gate electrodes of the corresponding address transistors 13. Each reset signal line 27 is connected to a gate electrode of each reset transistor 12.

The peripheral circuitry 120 includes a vertical scanning circuit 15, a horizontal signal readout circuit 20, a plurality of column signal processing circuits 19, a plurality of load circuits 18, a plurality of differential amplifiers 22, and the voltage control circuit 30. The vertical scanning circuit 15 is also called a row scanning circuit. The horizontal signal readout circuit 20 is also called a column scanning circuit. The column signal processing circuits 19 are also called row signal accumulation circuits. The differential amplifiers 22 are called feedback amplifiers.

The vertical scanning circuit 15 is connected to the address signal lines 26 and the reset signal lines 27. The vertical scanning circuit 15 selects the pixels 110, arranged in the rows, for each row to perform readout of signal voltages and reset of the potentials of the pixel electrodes 50. The power-supply wires 21 supplies a predetermined power-supply voltage to the pixels 110. The horizontal signal readout circuit 20 is electrically connected to the column signal processing circuits 19. The column signal processing circuits 19 are electrically connected to the pixels 110, arranged in the columns, through the vertical signal lines 17 corresponding to the columns. Load circuits 18 are electrically connected to the vertical signal lines 17. The load circuits 18 and the corresponding amplifying transistors 11 form source follower circuits.

The differential amplifiers 22 are provided corresponding to the respective columns. Negative-side input terminals of the differential amplifiers 22 are connected to the corresponding vertical signal lines 17. Output terminals of the differential amplifiers 22 are connected to the pixels 110 through feedback lines 23 corresponding to the respective columns.

The vertical scanning circuit 15 applies a row selection signal for controlling on-and-off states of the address transistors 13 to the gate electrodes of the address transistors 13 through the address signal lines 26. As a result, the row to be read is scanned and selected. Signal voltages are read out from the pixels 110 in the selected row to the corresponding vertical signal lines 17. The vertical scanning circuit 15 also applies a reset signal for controlling on-and-off states of the reset transistors 12 to the gate electrodes of the reset transistors 12 through the reset signal lines 27. As a result, the row of the pixels 110 on which a reset operation is to be performed is selected. The vertical signal lines 17 transmit the signal voltages, read out from the pixels 110 selected by the vertical scanning circuit 15, to the column signal processing circuits 19.

The column signal processing circuits 19 perform noise suppression signal processing typified by correlated double sampling, analog-to-digital conversion (AD conversion), and so on. Specifically, the column signal processing circuits 19 include sample-hold circuits. The sample-hold circuits each include a capacitor, a transistor, and so on. The sample-hold circuits sample the signal voltages read out through the vertical signal lines 17 and temporarily hold the signal voltages. Digital values corresponding to voltage values of the held signal voltages are read out to the horizontal signal readout circuit 20.

The horizontal signal readout circuit 20 sequentially reads out signals from the column signal processing circuits 19 to a horizontal common signal line 28.

One of the drain electrode and the source of the reset transistor 12 is connected to the pixel electrode 50, as described above, and the differential amplifier 22 is connected to the other of the drain electrode and the source thereof through feedback line 23. Accordingly, when the address transistor 13 and the reset transistor 12 are in an electrically conductive state, the differential amplifier 22 receives an output value of the address transistor 13 via the negative-side input terminal of the differential amplifier 22. The differential amplifier 22 performs a feedback operation so that the gate potential of the amplifying transistor 11 reaches a predetermined feedback voltage. At this point in time, the value of the voltage output from the differential amplifier 22 is a positive voltage of 0 V or close to 0 V. The feedback voltage refers to the voltage output from the differential amplifier 22.

[Configuration of Pixels]

Figure 2:
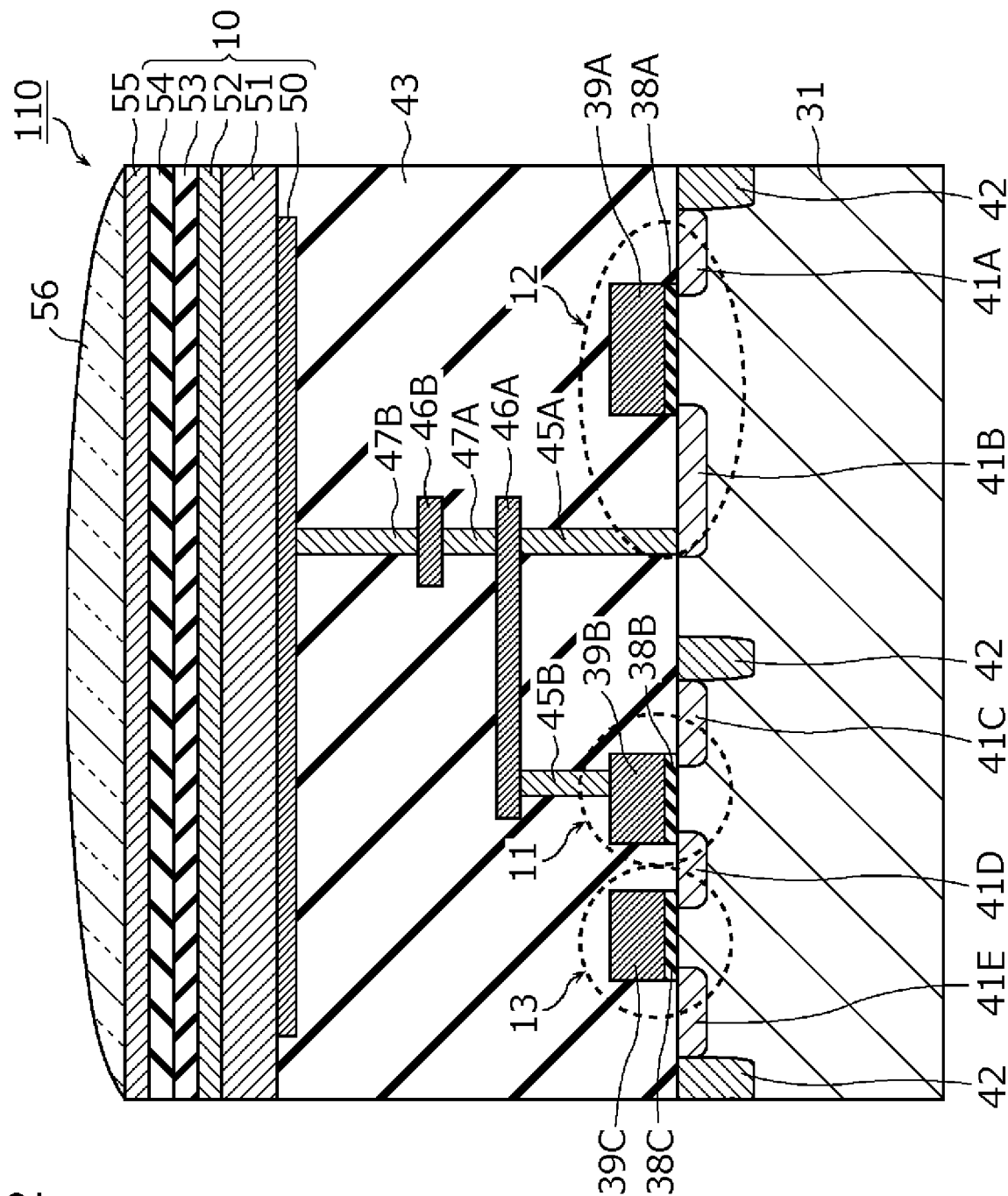
FIG. 2 is a sectional view of a device structure of one pixel in the imaging device according to the first embodiment.

A detailed device structure of one pixel 110 in the imaging device 100, will be described below with reference to FIG. 2. FIG. 2 is a sectional view schematically illustrating a cross section of the device structure of one pixel 110 in the imaging device 100 according to the present embodiment.

As illustrated in FIG. 2, the pixel 110 includes a semiconductor substrate 31, the charge detection circuit 25 (not illustrated), and the light detection portion 10. The semiconductor substrate 31 is, for example, a p-type silicon substrate. The charge detection circuit 25 detects a signal voltage acquired by the pixel electrode 50 and outputs the acquired signal charge. The charge detection circuit 25 includes the amplifying transistor 11, the reset transistor 12, and the address transistor 13, as described above, and is formed at the semiconductor substrate 31.

Each of the amplifying transistor 11, the reset transistor 12, and the address transistor 13 is one example of an electrical element formed at the semiconductor substrate 31. Each of the amplifying transistor 11, the reset transistor 12, and the address transistor 13 is, for example, a metal-oxide-semiconductor field-effect transistor (MOSFET). Specifically, each of the amplifying transistor 11, the reset transistor 12, and the address transistor 13 is an n-channel MOSFET or may be a p-channel MOSFET.

The amplifying transistor 11 has n-type impurity regions 41C and 41D, a gate insulating layer 38B, and a gate electrode 39B. The n-type impurity regions 41C and 41D are formed in the semiconductor substrate 31, one of the n-type impurity regions 41C and 41D functions as a drain, and the other functions as a source. The gate insulating layer 38B is located on the semiconductor substrate 31. The gate electrode 39B is located on the gate insulating layer 38B.

The reset transistor 12 includes n-type impurity regions 41A and 41B, a gate insulating layer 38A, and a gate electrode 39A. The n-type impurity regions 41A and 41B are formed in the semiconductor substrate 31, one of the n-type impurity regions 41A and 41B functions as a drain, and the other functions as a source. The gate insulating layer 38A is located on the semiconductor substrate 31. The gate electrode 39A is located on the gate insulating layer 38A.

The address transistor 13 has n-type impurity regions 41D and 41E, a gate insulating layer 38C, and a gate electrode 39C. The n-type impurity regions 41D and 41E are formed in the semiconductor substrate 31, one of the n-type impurity regions 41D and 41E functions as a drain, and the other functions as a source. The gate insulating layer 38C is located on the semiconductor substrate 31. The gate electrode 39C is located on the gate insulating layer 38C.

The gate insulating layers 38A, 38B, and 38C are formed using an insulating material. For example, the gate insulating layers 38A, 38B, and 38C have a single-layer structure of a silicon oxide film or a silicon nitride film or a stacked structure of a silicon oxide film or a silicon nitride film.

The gate electrodes 39A, 39B, and 39C are each formed using an electrically conductive material. For example, the gate electrodes 39A, 39B, and 39C are formed using polysilicon given electrical conductivity by impurity addition. Alternatively, the gate electrodes 39A, 39B, and 39C may be formed using a metallic material, such as copper.

The n-type impurity regions 41A, 41B, 41C, 41D, and 41E are formed, for example, by doping the semiconductor substrate 31 with n-type impurities, such as phosphorous (P), by ion implantation or the like. In the example illustrated in FIG. 2, the n-type impurity region 41D is shared by the amplifying transistor 11 and the address transistor 13. Thus, the amplifying transistor 11 and the address transistor 13 are connected in series. The n-type impurity region 41D may be separated into two n-type impurity regions. The two n-type impurity regions may be electrically connected via a wiring layer.

In the semiconductor substrate 31, an element isolation region 42 is provided between the adjacent pixels 110 and between the amplifying transistor 11 and the reset transistor 12. The element isolation region 42 provides electrical isolation between the adjacent pixels 110. Also, the provision of the element isolation region 42 suppresses or reduces leakage of the signal charge accumulated in the charge accumulation node 24. The element isolation region 42 is formed, for example, by doping the semiconductor substrate 31 with p-type impurities at high concentration.

A multilayer wiring structure is provided on an upper surface of the semiconductor substrate 31. The multilayer wiring structure includes a plurality of interlayer insulating layers, one or more wiring layers, one or more plugs, and one or more contact plugs. Specifically, an interlayer insulating layer 43 is stacked on the upper surface of the semiconductor substrate 31. Contact plugs 45A and 45B, wires 46A and 46B, and electrically conductive plugs 47A and 47B are buried in the interlayer insulating layer 43. The interlayer insulating layer 43 is formed by stacking a plurality of insulating layers in sequence. An upper surface of the interlayer insulating layer 43 is, for example, planar and is parallel to the upper surface of the semiconductor substrate 31.

The contact plug 45A is connected to the n-type impurity region 41B of the reset transistor 12. The contact plug 45B is connected to the gate electrode 39B of the amplifying transistor 11. The wire 46A provides connection between the contact plugs 45A and 45B. Thus, the n-type impurity region 41B of the reset transistor 12 is electrically connected to the gate electrode 39B of the amplifying transistor 11.

The wire 46A is also connected to the pixel electrode 50 via the electrically conductive plug 47A, the wire 46B, and the electrically conductive plug 47B. With this arrangement, the n-type impurity region 41B, the gate electrode 39B, the contact plugs 45A and 45B, the wires 46A and 46B, the electrically conductive plugs 47A and 47B, and the pixel electrode 50 constitute the charge accumulation node 24.

The light detection portion 10 is provided on the interlayer insulating layer 43. The light detection portion 10 includes the transparent electrode 52, the photoelectric conversion film 51, and the pixel electrode 50 that is located more adjacent to the semiconductor substrate 31 than the transparent electrode 52.

The photoelectric conversion film 51 photoelectrically converts light that is incident from the transparent electrode 52, to thereby generate signal charge corresponding to the intensity of the incident light. The photoelectric conversion film 51 is composed of, for example, an organic semiconductor. The photoelectric conversion film 51 may include one or more organic semiconductor layers. For example, the photoelectric conversion film 51 may include a carrier transporting layer that transports electrons or holes, a blocking layer that blocks carriers, and so on, in addition to a photoelectric conversion layer that generates hole-electron pairs. These organic semiconductor layers may be implemented by organic p-type semiconductors or organic n-type semiconductors containing known material. The photoelectric conversion film 51 may be, for example, a composite film of organic donor molecules and acceptor molecules, a composite film of semiconductor carbon nanotubes and acceptor molecules, or a quantum dot-containing film. The photoelectric conversion film 51 is formed using an inorganic material, such as amorphous silicon.

The photoelectric conversion film 51 is sandwiched between the transparent electrode 52 and the pixel electrode 50. In the present embodiment, the photoelectric conversion film 51 is continuously formed through one or more pixels 110. Specifically, the photoelectric conversion film 51 is formed in a single-plate shape so as to cover most of an imaging region in plan view. The photoelectric conversion film 51 may be separately provided for each pixel 110.

The transparent electrode 52 is one example of a top electrode located above the photoelectric conversion film 51. The transparent electrode 52 is transparent to light to be detected and is formed using a material having an electrical conductivity property. For example, the transparent electrode 52 is formed using a transparent electrically conductive semiconductor oxide film containing indium tin oxide (ITO), aluminum-doped zinc oxide (AZO), gallium-doped zinc oxide (GZO), or the like. The transparent electrode 52 may be formed using another transparent electrically conductive semiconductor or may be formed using a metallic film that is thin to a light-transmissive degree.

The transparent electrode 52 is continuously formed through two or more pixels 110, similarly to the photoelectric conversion film 51. Specifically, in plan view, the transparent electrode 52 is formed in a single-plate shape so as to cover most of the imaging region. The transparent electrode 52 continuously covers an entire upper surface of the photoelectric conversion film 51.

The pixel electrode 50 is one example of a bottom electrode that faces the top electrode, with the photoelectric conversion film 51 being interposed therebetween. The pixel electrode 50 is provided for each pixel 110. The pixel electrode 50 is formed, for example, using an electrically conductive material, including metal such as aluminum or copper, polysilicon given electrical conductivity by impurity doping, or the like.

The light detection portion 10 further includes an insulating layer 53 formed on at least part of an upper surface of the transparent electrode 52. The light detection portion 10 further includes a protection film 54. The insulating layer 53 is formed to cover at least part of the upper surface of the transparent electrode 52. The protection film 54 is provided above the insulating layer 53.

The insulating layer 53 and the protection film 54 are formed using a material having an insulation property. For example, the insulating layer 53 is formed of silicon oxide, silicon nitride, silicon oxynitride, an organic or inorganic polymer material, or the like. The insulating layer 53 and the protection film 54 are transparent to, for example, light having wavelengths to be detected by the imaging device 100.

As illustrated in FIG. 2, the pixel 110 includes a color filter 55 above the transparent electrode 52 of the light detection portion 10. The pixel 110 further includes a microlens 56 on the color filter 55. The pixel 110 does not necessarily have to include the insulating layer 53, the protection film 54, the color filter 55, and the microlens 56.

[Structure of End Portion of Imaging Device]

Subsequently, a structure of an end portion of the imaging device 100 according to the present embodiment will be described with reference to FIGS. 3 and 4.

Figure 3:
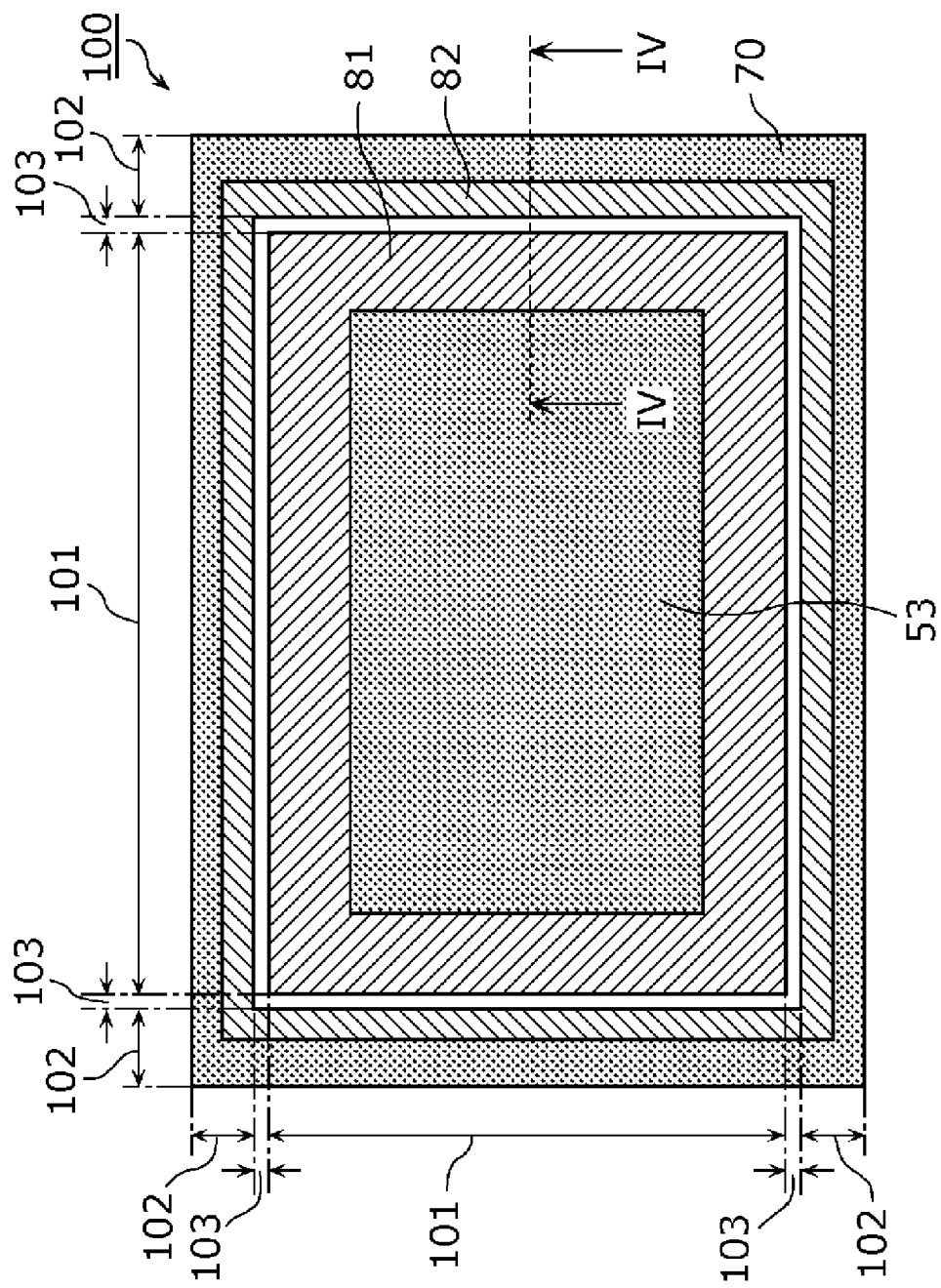
FIG. 3 is a plan view of the imaging device according to the first embodiment.

FIG. 3 is a plan view of the imaging device 100 according to the present embodiment. FIG. 4 is a sectional view of the imaging device 100 according to the present embodiment, taken along line IV-IV in FIG. 3.

Figure 4:
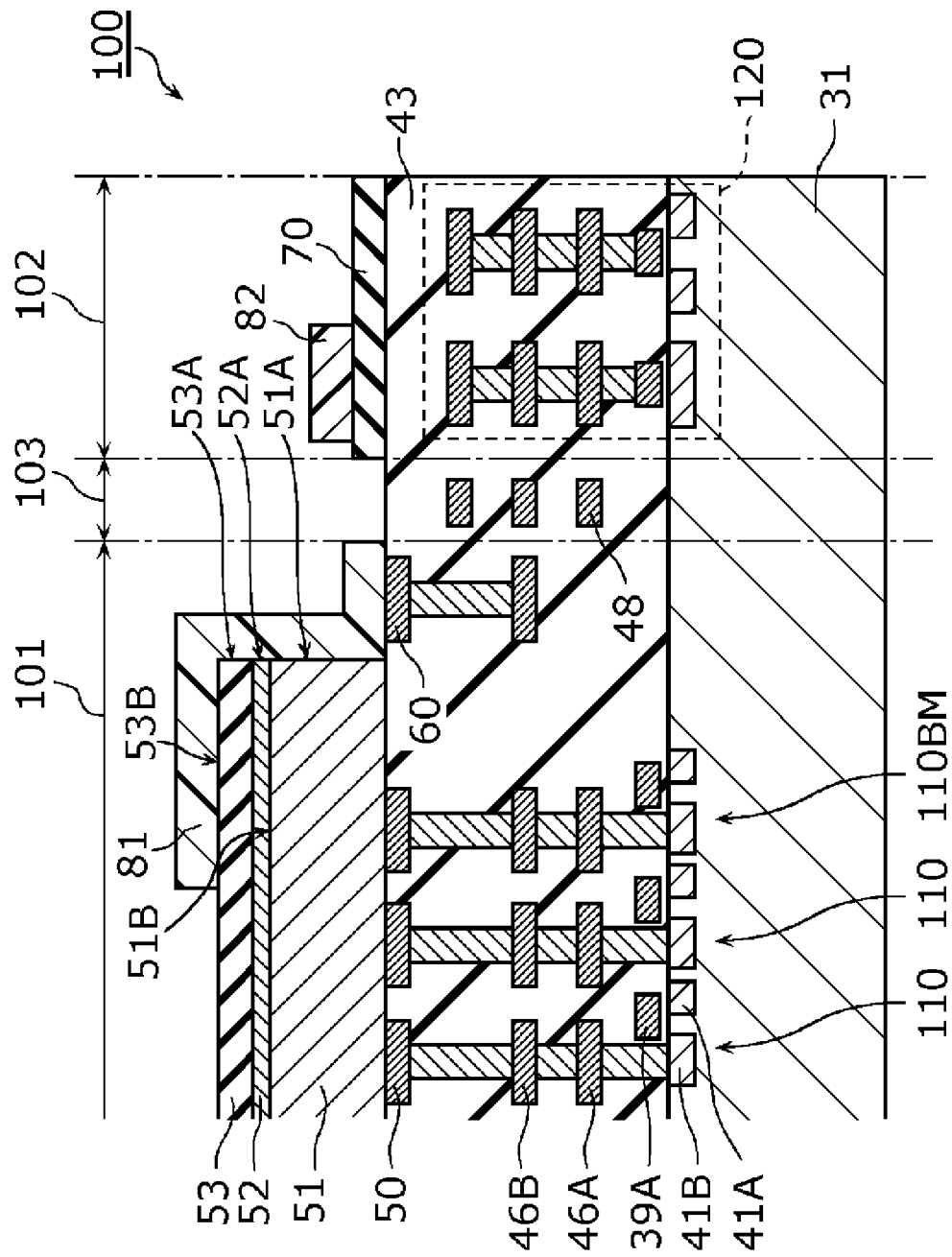
FIG. 4 is a sectional view of the imaging device according to the first embodiment, taken along IV-IV line in FIG. 3.

As illustrated in FIGS. 3 and 4, the imaging device 100 includes a pixel section 101 and a peripheral circuitry section 102 provided around the pixel section 101. Also, the imaging device 100 includes a separating section 103 that separates the pixel section 101 and the peripheral circuitry section 102.

The protection film 54, the color filter 55, and the microlens 56 illustrated in FIG. 2 are not illustrated in FIGS. 3 and 4. The protection film 54 is provided, for example, so as to cover the insulating layer 53, a first light-shielding film 81, a second light-shielding film 82, and an insulating layer 70. The color filter 55 and the microlens 56 are provided directly above the pixel 110. The color filter 55 and the microlens 56 are not provided directly above the first light-shielding film 81 and are not provided in the separating section 103 and the peripheral circuitry section 102.

In plan view, the pixel section 101 is located at a center of the imaging device 100 and corresponds to the pixel region where the pixels 110 are arranged. The peripheral circuitry section 102 is provided in a frame shape so as to surround the periphery of the pixel section 101. Thus, the separating section 103 is also provided in a frame shape so as to surround the periphery of the pixel section 101. The separating section 103 is a frame-shape region located between the pixel section 101 and the peripheral circuitry section 102.

The peripheral circuitry section 102 may be provided at only part of the periphery of the pixel section 101. For example, when the pixel section 101 has a rectangular shape in plan view, as illustrated in FIG. 3, the peripheral circuitry section 102 does not necessarily have to be provided at a portion along at least one side of the contour of the pixel section 101. For example, the peripheral circuitry section 102 may be provided at a portion along only one side of the contour of the pixel section 101. Alternatively, the peripheral circuitry section 102 may be provided along two opposing sides or two adjacent sides of the contour of the pixel section 101. The same also applies to the separating section 103.

As illustrated in FIGS. 3 and 4, the pixel section 101 includes the first light-shielding film 81. The first light-shielding film 81 realizes two functions, that is, power supply to the transparent electrode 52 and light shielding of pixels 110BM, which are some of the pixels 110 included in the pixel section 101.

Specifically, the first light-shielding film 81 has an electrical conductivity property and is electrically connected to the transparent electrode 52. In the present embodiment, as illustrated in FIG. 4, the first light-shielding film 81 is in contact with an end surface 52A of the transparent electrode 52.

The first light-shielding film 81 is electrically connected to electrode terminals 60 that are provided so as to be exposed at the upper surface of the interlayer insulating layer 43. The electrode terminals 60 are electrically connected to the corresponding counter-electrode signal lines 16 (see FIG. 1) in the interlayer insulating layer 43. Thus, the transparent electrode 52 is electrically connected to the voltage control circuit 30 (see FIG. 1) through the first light-shielding film 81, the electrode terminals 60, and the counter-electrode signal lines 16. That is, the first light-shielding film 81 constitutes a part of electrical wires for applying a predetermined voltage to the transparent electrode 52. A predetermined voltage is applied to the first light-shielding film 81, and a value of the voltage can vary in accordance with the operating state of the imaging device 100. That is, a variable voltage is applied to the first light-shielding film 81. The variable voltage includes, for example, a first voltage that is applied during exposure and a second voltage that is applied during pixel readout. The first voltage and the second voltage are selectively applied to the transparent electrode 52 via the first light-shielding film 81 in accordance with the operating state of the imaging device 100.

Also, the first light-shielding film 81 covers the pixels 110BM. Of the pixels 110 included in the pixel section 101, the pixels 110BM are the pixels 110 that are the closest to an end portion of the pixel section 101, specifically, that are the closest to the peripheral circuitry section 102 or the separating section 103. In plan view, the pixels 110BM are provided in a frame shape along the contour of the pixel section 101. Alternatively, the pixels 110BM are provided only at part of the end portion of the pixel section 101. For example, the pixels 110BM do not necessarily have to be provided at a portion along at least one side of the contour of the pixel section 101. For example, the pixels 110BM may be provided at a portion along only one side of the contour of the pixel section 101. Alternatively, the pixels 110BM may be provided along two opposing sides or two adjacent sides of the contour of the pixel section 101.

The pixels 110BM are pixels for black correction processing in the imaging device 100 and are covered by the first light-shielding film 81 so that no light is incident on the pixels 110BM. That is, in plan view, all the pixels 110BM are located inside the first light-shielding film 81. Specifically, in plan view, the first light-shielding film 81 overlaps part of the upper surface of the photoelectric conversion film 51. More specifically, the first light-shielding film 81 covers an end surface 51A and an upper surface end portion 51B of the photoelectric conversion film 51. The upper surface end portion 51B is one portion of the upper surface of the photoelectric conversion film 51 and is a portion including the pixels 110BM in plan view. The upper surface end portion 51B does not include the pixels 110 in plan view. The plan-view shape of each pixel 110BM matches, for example, the plan-view shape of the pixel electrode 50.

In the present embodiment, as illustrated in FIG. 4, the first light-shielding film 81 is in contact with and covers an upper surface end portion 53B of the insulating layer 53, an end surface 53A of the insulating layer 53, the end surface 52A of the transparent electrode 52, the end surface 51A of the photoelectric conversion film 51, the electrode terminals 60, and vicinity portions of the electrode terminals 60, the vicinity portion being part of the upper surface of the interlayer insulating layer 43. Similarly to the upper surface end portion 51B of the photoelectric conversion film 51, in plan view, the upper surface end portion 53B of the insulating layer 53 includes a portion that includes the pixels 110BM and that does not include the other pixels 110.

As illustrated in FIG. 3, the first light-shielding film 81 is provided in a frame shape along an outer periphery of the pixel section 101 in plan view. The region inside an inner periphery of the first light-shielding film 81 is the photosensitive region. That is, the pixels 110 arranged inside the inner periphery of the first light-shielding film 81 in plan view perform photoelectric conversion to generate signal charge, and imaging is performed based on the signal charge.

The first light-shielding film 81 does not necessarily have to be provided at a portion where the pixels 110BM are not provided. For example, when the pixels 110BM are provided only at a portion along one side of the pixel section 101, the first light-shielding film 81 may be provided along the side. That is, the plan-view shape of the first light-shielding film 81 does not necessarily have to be a frame shape and may be a long rectangular shape along one side of the contour of the pixel section 101 or an L shape along two sides thereof.

As illustrated in FIGS. 3 and 4, the peripheral circuitry section 102 includes the second light-shielding film 82. In plan view, the second light-shielding film 82 overlaps at least part of the peripheral circuitry 120. Specifically, in plan view, the second light-shielding film 82 overlaps the sample-hold circuits (not illustrated in FIG. 4) included in the peripheral circuitry 120. Also, in plan view, the second light-shielding film 82 may overlap transistors or diodes included in circuits other than the sample-hold circuits included in the peripheral circuitry 120. For example, in plan view, the second light-shielding film 82 may overlap the entire peripheral circuitry 120.

Transistors included in the sample-hold circuits and so on have impurity regions formed in the semiconductor substrate 31. Each of the impurity regions serves as a source or a drain. Since the impurity regions are n-type impurity regions formed in the p-type semiconductor substrate 31, p-n junctions are formed at the boundaries of the impurity regions. The diodes included in the sample-hold circuits similarly have p-n junctions.

If light is incident on the p-n junctions, charge is generated due to the incident light, and the generated charge can cause current leakage or potential fluctuation. In particular, the sample-hold circuits temporarily hold signal charge generated by the pixels 110, and thus, when charge other than the signal charge is generated in the sample-hold circuits, the image quality of images generated by the imaging device 100 can deteriorate.

According to the present embodiment, since the transistors and the diodes are covered by the second light-shielding film 82, it is possible to suppress or reduce light incidence on the p-n junctions. This allows the peripheral circuitry 120 to stably operate. In addition, since it is possible to suppress or reduce light-induced generation of charge other than the signal charge in the sample-hold circuits, it is possible to suppress or reduce deterioration of the image quality.

As illustrated in FIG. 3, in plan view, the second light-shielding film 82 is provided in a frame shape along an inner periphery of the peripheral circuitry section 102. The plan-view shape of the second light-shielding film 82 does not necessarily have to be a frame shape and may be a long rectangular shape along one side of the inner periphery of the peripheral circuitry section 102 or an L shape along two sides thereof.

The first light-shielding film 81 and the second light-shielding film 82 are generated, for example, using the same material. Thus, the second light-shielding film 82 has an electrical conductivity property, similarly to the first light-shielding film 81. The first light-shielding film 81 and the second light-shielding film 82 are, for example, metal films of titanium (Ti), molybdenum (Mo), or the like or metal nitride films of titanium nitride (TiN), tantalum nitride (TaN), or the like.

In the present embodiment, as illustrated in FIG. 4, the peripheral circuitry section 102 further includes the insulating layer 70. The second light-shielding film 82 is provided above the insulating layer 70. Specifically, the second light-shielding film 82 is located at a position that is above the upper surface of the interlayer insulating layer 43 and that is higher than a lower surface of at least the photoelectric conversion film 51. In the present embodiment, the second light-shielding film 82 is provided in contact with an upper surface of the insulating layer 70.

The insulating layer 70 is located between the second light-shielding film 82 and the interlayer insulating layer 43. In plan view, the insulating layer 70 overlaps the upper surface of the interlayer insulating layer 43. Thus, even when part of the wiring structure is exposed at the upper surface of the interlayer insulating layer 43, it is possible to prevent the exposed part of the wiring structure from contacting the second light-shielding film 82 and from becoming electrically continuous.

The insulating layer 70 is formed, for example, using the same material as the material of the insulating layer 53. Thus, the insulating layer 70 is light transmissive, similarly to the insulating layer 53. Specifically, the insulating layer 70 is a silicon oxide film, a silicon nitride film, or the like. The insulating layer 70 can be formed in the same processes as those of the insulating layer 53. For example, after the photoelectric conversion film 51 and the transparent electrode 52 are patterned to have predetermined shapes, an insulating film is formed on an entire surface including the upper surface of the transparent electrode 52 and is patterned by photolithography and etching, to thereby allow the insulating layer 53 and the insulating layer 70 to be formed at the same time. Thus, the thickness of the insulating layer 70 becomes the same as the thickness of the insulating layer 53. Needless to say, the insulating layer 70 may be formed using a material that is not light transmissive.

Also, in the present embodiment, the first light-shielding film 81 and the second light-shielding film 82 can be formed in the same processes. For example, after the insulating layer 53 and the insulating layer 70 are formed, an electrically conductive light-shielding film is formed so as to cover the upper surface of the insulating layer 53 and the insulating layer 70 and is patterned by photolithography and etching, to thereby allow the first light-shielding film 81 and the second light-shielding film 82 to be formed at the same time. Thus, the thickness of the first light-shielding film 81 becomes the same as the thickness of the second light-shielding film 82.

As illustrated in FIGS. 3 and 4, the first light-shielding film 81 and the second light-shielding film 82 are separated from each other. That is, the first light-shielding film 81 and the second light-shielding film 82 are not physically connected to each other. The separating section 103 is located between the first light-shielding film 81 and the second light-shielding film 82 in plan view. The separating section 103 is, for example, a region between an end portion of an outer periphery side of the first light-shielding film 81 and the insulating layer 70. Although an example in which an end portion of an inner periphery side of the insulating layer 70 and an end portion of an inner periphery side of the second light-shielding film 82 match each other is shown in FIG. 3, for convenience of illustration, the second light-shielding film 82 is provided more outside than the end portion of the inner periphery side of the insulating layer 70, as illustrated in FIG. 4.

Alternatively, the end portion of the inner periphery side of the second light-shielding film 82 and the end portion of the inner periphery side of the insulating layer 70 may match each other, as illustrated in FIG. 3. That is, the separating section 103 may be a region between the end portion of the outer periphery side of the first light-shielding film 81 and the end portion of the inner periphery side of the second light-shielding film 82. For example, if the insulating layer 70 is not provided, the separating section 103 corresponds to the region between the end portion of the outer periphery side of the first light-shielding film 81 and the end portion of the inner periphery side of the second light-shielding film 82.

Since the first light-shielding film 81 and the second light-shielding film 82 are separated from each other, fluctuation of the potential of the first light-shielding film 81 has almost no influence on the second light-shielding film 82. In other words, even when the potential of the first light-shielding film 81 fluctuates, the potential of the second light-shielding film 82 is maintained constant, thus sufficiently suppressing or reducing influences on the peripheral circuitry 120 covered by the second light-shielding film 82. Therefore, according to the present embodiment, the peripheral circuitry 120 can be stably operated independently of fluctuation of the potential of the first light-shielding film 81.

In the present embodiment, the sample-hold circuits are not provided in the separating section 103. That is, in plan view, the sample-hold circuits are not disposed between the first light-shielding film 81 and the second light-shielding film 82. In other words, all the sample-hold circuits included in the imaging device 100 are provided in the peripheral circuitry section 102. For example, all the sample-hold circuits are disposed directly below the second light-shielding film 82. At least one of all the sample-hold circuits may be included in the pixel section 101 or may be disposed, for example, directly below the first light-shielding film 81.

Also, in plan view, no transistor is disposed between the first light-shielding film 81 and the second light-shielding film 82. In other words, all transistors included in the imaging device 100 are provided in either of the pixel section 101 and the peripheral circuitry section 102.

Also, in plan view, no diode may be provided between the first light-shielding film 81 and the second light-shielding film 82. In other words, all diodes included in the imaging device 100 may be provided in either of the pixel section 101 and the peripheral circuitry section 102.

As illustrated in FIG. 4, only wires 48 included in the interlayer insulating layer 43 are provided in the separating section 103. Electrically conductive plugs that connect two or more wires 48 disposed in different layers may be provided in the separating section 103. For example, circuit elements other than electrical wires are not provided in the separating section 103. In other words, the separating section 103 can be defined as a region where circuit elements other than electrical wires are not provided in plan view. Also, the impurity regions formed in the semiconductor substrate 31 are not provided in the separating section 103.

Thus, since charge generation induced by light can be suppressed in the separating section 103 through which light can reach the semiconductor substrate 31, it is possible to suppress or reduce adverse effects on the operation of the peripheral circuitry 120. Also, since the area of the pixel section 101 and the area of the peripheral circuitry section 102 can be defined by the separating section 103, the arrangement regions of the individual circuit elements become clear to make it possible to simplify the circuit design.

Second Embodiment

Subsequently, a second embodiment will be described with reference to FIG. 5.

Figure 5:
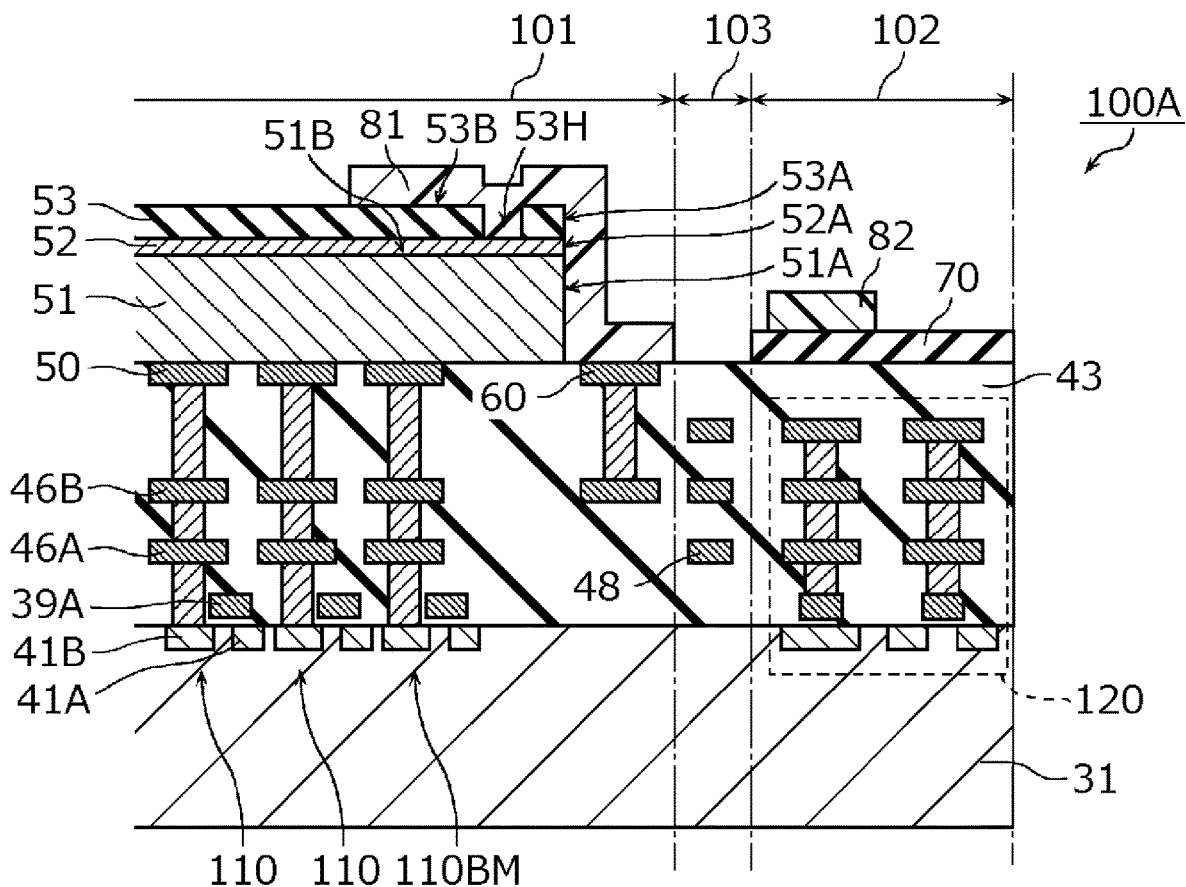
FIG. 5 is a sectional view of an imaging device according to a second embodiment.

FIG. 5 is a sectional view of an imaging device 100A according to the present embodiment. FIG. 5 illustrates a cross section corresponding to line Iv-Iv in FIG. 3, as in FIG. 4. Hereinafter, points that differ from the first embodiment will be mainly described, and descriptions of common points will be omitted or briefly given.

As illustrated in FIG. 5, in the imaging device 100A, a contact hole 53H is formed in the insulating layer 53. The contact hole 53H is a through hole that penetrates through the insulating layer 53 in order to expose the upper surface of the transparent electrode 52. In plan view, for example, the contact hole 53H is provided in a frame shape along the contour of the pixel section 101.

In the present embodiment, the first light-shielding film 81 is provided so as to fill the contact hole 53H. That is, the first light-shielding film 81 is in contact with the end surface 52A of the transparent electrode 52 and with a portion included the transparent electrode 52 and exposed to the contact hole 53H. Since the area where the first light-shielding film 81 and the transparent electrode 52 contact each other increases, it is possible to reduce the contact resistance between the first light-shielding film 81 and the transparent electrode 52.

Third Embodiment

Subsequently, a third embodiment will be described with reference to FIG. 6.

Figure 6:
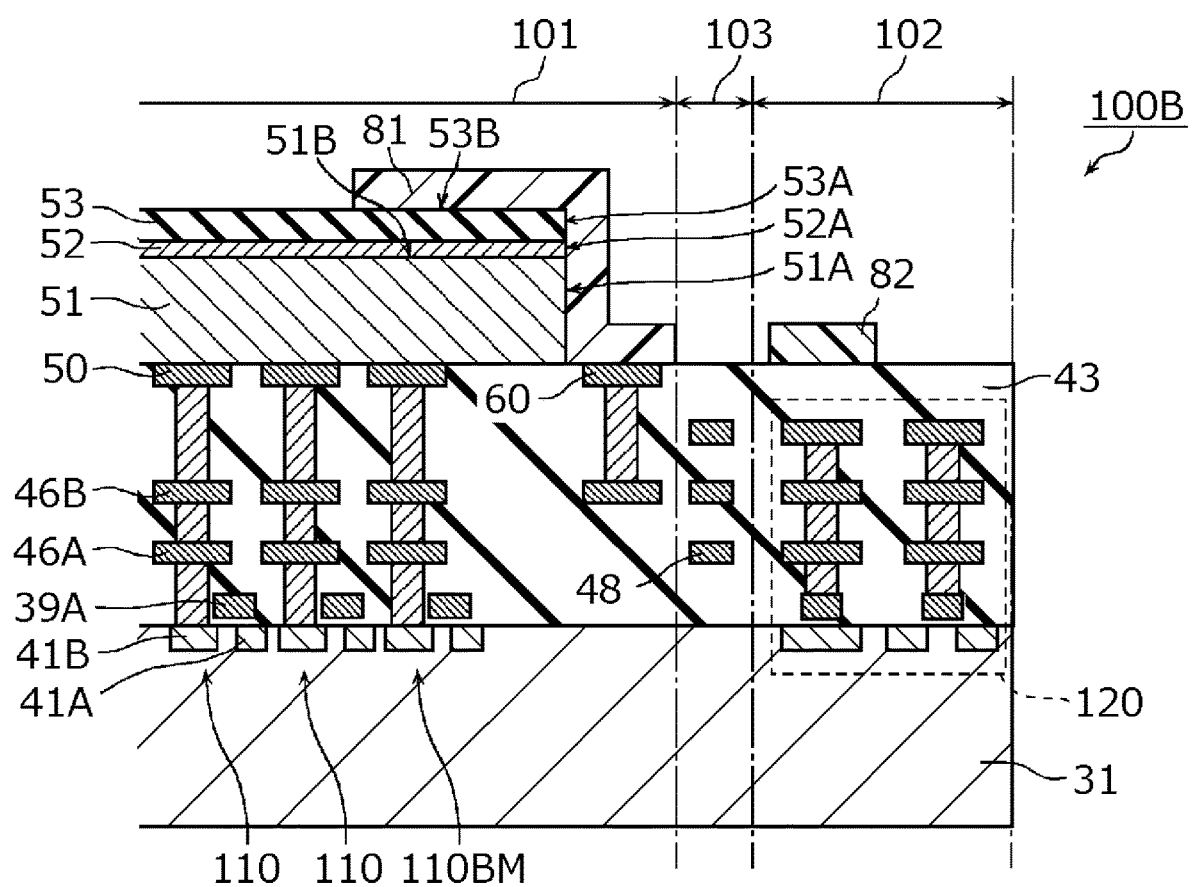
FIG. 6 is a sectional view of an imaging device according to a third embodiment.

FIG. 6 is a sectional view of an imaging device 100B according to the present embodiment. FIG. 6 illustrates a cross section corresponding to line Iv-Iv in FIG. 3, as in FIG. 4. Hereinafter, points that differ from the first embodiment will be mainly described, and descriptions of common points will be omitted or briefly given.

As illustrated in FIG. 6, in the imaging device 100B, the peripheral circuitry section 102 does not include the insulating layer 70. That is, the second light-shielding film 82 is directly provided on the upper surface of the interlayer insulating layer 43. In this case, for example, a lower surface of the second light-shielding film 82 and a lower surface of the first light-shielding film 81 are located at the same height with reference to the upper surface of the semiconductor substrate 31. The second light-shielding film 82 is at the same height and has the same thickness as those of the end portion of the outer periphery side of the first light-shielding film 81, that is, those of the portion that covers the electrode terminals 60.

In the present embodiment, in the peripheral circuitry section 102, the wiring structure is not exposed at the region that is included in the upper surface of the interlayer insulating layer 43 and that is in contact with at least the second light-shielding film 82. That is, the insulation between the upper surface of the interlayer insulating layer 43 and the second light-shielding film 82 is ensured. Thus, even if a potential is given to the second light-shielding film 82, it is possible to sufficiently suppress or reduce influences on the operation of the peripheral circuitry 120.

Fourth Embodiment

Subsequently, a fourth embodiment will be described with reference to FIG. 7.

Figure 7:
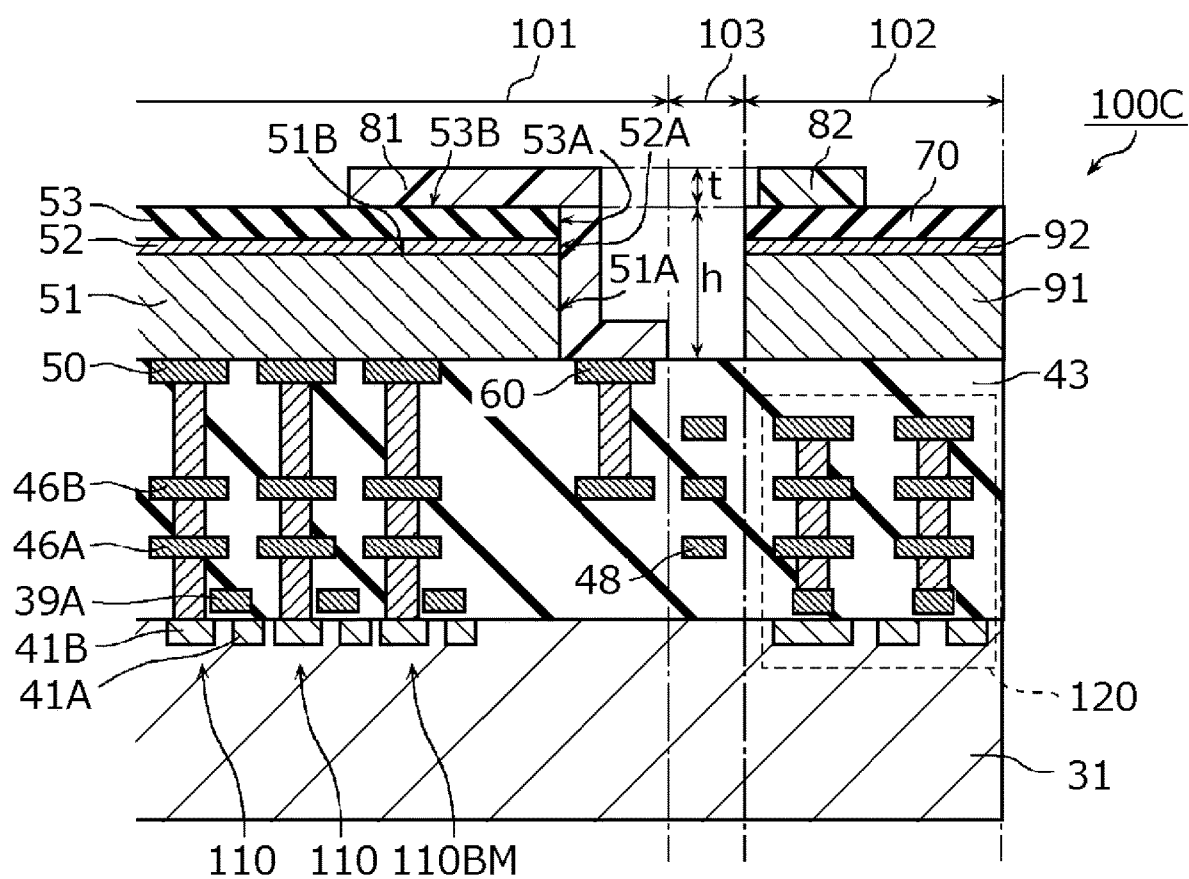
FIG. 7 is a sectional view of an imaging device according to a fourth embodiment.

FIG. 7 is a sectional view of an imaging device 100C according to the present embodiment. FIG. 7 illustrates a cross section corresponding to line IV-IV in FIG. 3, as in FIG. 4. Hereinafter, points that differ from the first embodiment will be mainly described, and descriptions of common points will be omitted or briefly given.

As illustrated in FIG. 7, in the imaging device 100C, the pixel section 101 and the peripheral circuitry section 102 have substantially the same film structure on the interlayer insulating layer 43. Specifically, the peripheral circuitry section 102 further includes a spacer layer 91 and a transparent electrically conductive film 92.

The spacer layer 91 includes the same material as the material of the photoelectric conversion film 51 and overlaps at least part of the peripheral circuitry 120 in plan view. In the present embodiment, the spacer layer 91 is provided in contact with the upper surface of the interlayer insulating layer 43. The spacer layer 91 has a structure that is substantially the same as that of the photoelectric conversion film 51. Specifically, the spacer layer 91 has a material and a thickness that are the same as those of the photoelectric conversion film 51 and is formed in the same processes as those of the photoelectric conversion film 51. The photoelectric conversion film 51 is formed, for example, by applying a photoelectric conversion material to the entire upper surface of the interlayer insulating layer 43 and patterning the upper surface. In the first embodiment, the photoelectric conversion material disposed in the peripheral circuitry section 102 is removed, whereas in the present embodiment, the photoelectric conversion material disposed in the peripheral circuitry section 102 is left without being removed, so that the spacer layer 91 is formed.

The transparent electrically conductive film 92 includes the same material as the transparent electrode 52 and overlaps at least part of the peripheral circuitry 120 in plan view. In the present embodiment, the transparent electrically conductive film 92 is provided in contact with an upper surface of the spacer layer 91. The transparent electrically conductive film 92 has substantially the same structure as the transparent electrode 52. Specifically, the transparent electrically conductive film 92 has a material and a thickness that are the same as those of the transparent electrode 52 and is formed in the same processes as those of the transparent electrode 52.

In the present embodiment, the second light-shielding film 82 is provided above the spacer layer 91. Specifically, the insulating layer 70 is provided between the second light-shielding film 82 and the spacer layer 91. The insulating layer 70 is provided in contact with an upper surface of the transparent electrically conductive film 92.

The height of the upper surface of the insulating layer 70 is equal to the height of an upper surface of the insulating layer 53, as denoted by dimension h in FIG. 7. The height in this case is a height with reference to the upper surface of the interlayer insulating layer 43. In other words, the total value of the thicknesses of the photoelectric conversion film 51, the transparent electrode 52, and the insulating layer 53 is equal to the total value of the thicknesses of the spacer layer 91, the transparent electrically conductive film 92, and the insulating layer 70.

Thus, the height of a lower surface of an end portion of an inner periphery side of the first light-shielding film 81 and the height of the lower surface of the second light-shielding film 82 are also equal to each other. As illustrated in FIG. 7, the end portion of the inner periphery side of the first light-shielding film 81 and the second light-shielding film 82 are formed to have the same height and the same thickness t.

As described above, the end portion of the pixel section 101 and the peripheral circuitry section 102 are substantially the same in the structure of the films formed on the upper surface of the interlayer insulating layer 43. Thus, a merit arises in a manufacturing method. Specifically, after a film for the photoelectric conversion film 51 and the spacer layer 91, a film for the transparent electrode 52 and the transparent electrically conductive film 92, and a film for the insulating layer 53 and the insulating layer 70 are each formed, photolithography and etching are performed on the formed films to thereby make it possible to separate the films between the pixel section 101 and the peripheral circuitry section 102. Thus, the plan-view shape of the photoelectric conversion film 51, the plan-view shape of the transparent electrode 52, and the plan-view shape of the insulating layer 53 can be made equal to each other. Also, the plan-view shape of the spacer layer 91, the plan-view shape of the transparent electrically conductive film 92, and the plan-view shape of the insulating layer 70 can be made equal to each other.

After the film separation is performed, an electrically conductive light-shielding film for the first light-shielding film 81 and the second light-shielding film 82 is formed and is then patterned to thereby make it possible to separate the electrically conductive light-shielding film between the pixel section 101 and the peripheral circuitry section 102.

Fifth Embodiment

Subsequently, a fifth embodiment will be described with reference to FIG. 8.

Figure 8:
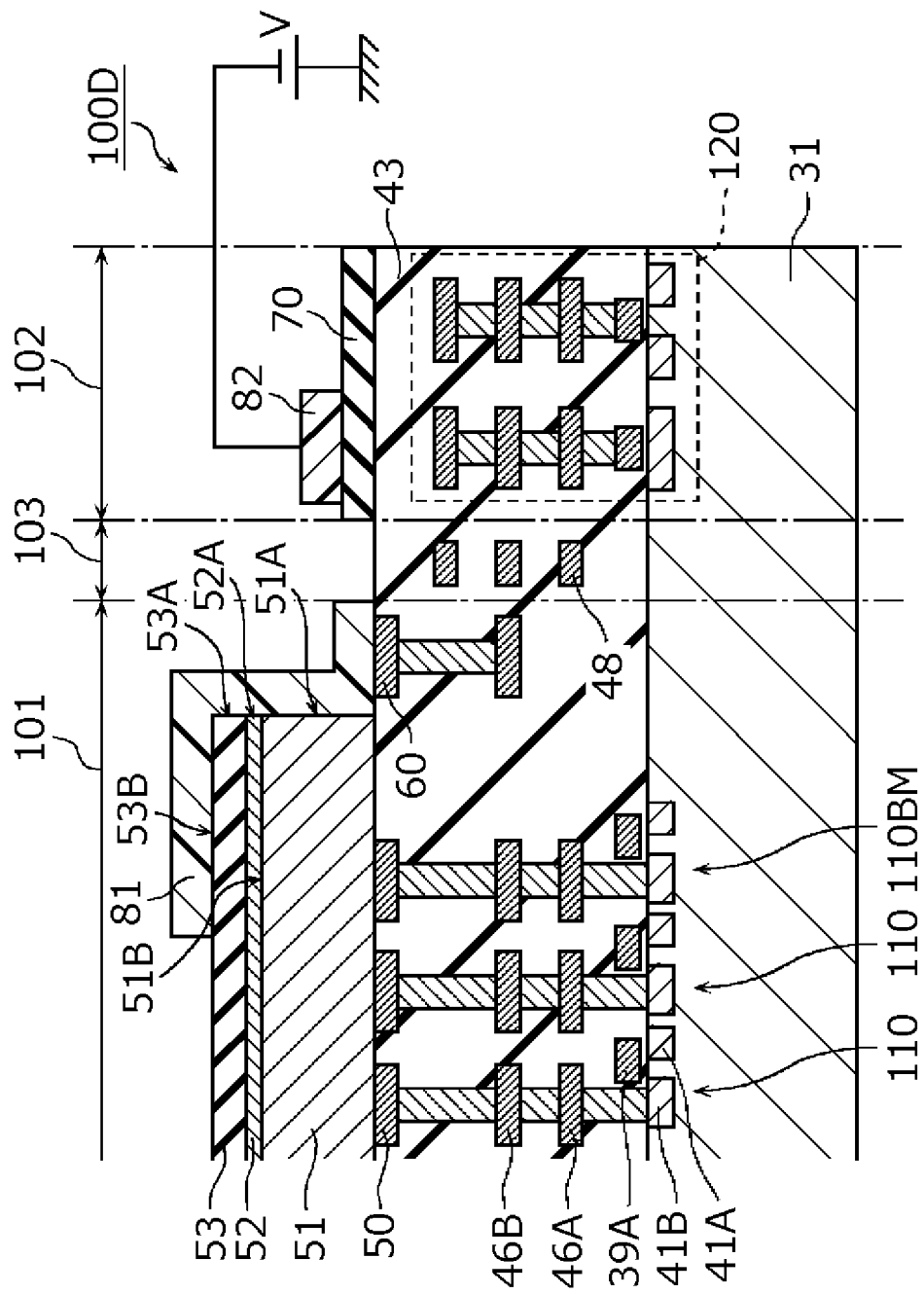
FIG. 8 is a sectional view of an imaging device according to a fifth embodiment.

FIG. 8 is a sectional view of an imaging device 100D according to the present embodiment. FIG. 8 illustrates a cross section corresponding to line IV-IV in FIG. 3, as in FIG. 4. Hereinafter, points that differ from the first embodiment will be mainly described, and descriptions of common points will be omitted or briefly given.

As illustrated in FIG. 8, the imaging device 100D has a structure that is substantially the same as the structure of the imaging device 100 illustrated in FIG. 4. In the present embodiment, a constant voltage is applied to the second light-shielding film 82. Although the constant voltage is, for example, a negative voltage, it may be a ground voltage (i.e., 0 V).

This makes it possible to maintain the potential of the second light-shielding film 82 constant, thus allowing the second light-shielding film 82 to serve as a shield electrode. Specifically, the second light-shielding film 82 can shield an electric field or magnetic field that affects the peripheral circuitry 120 and can make the operation of the peripheral circuitry 120 stable. This makes it possible to enhance the reliability of the imaging device 100D.

Sixth Embodiment

Subsequently, a sixth embodiment will be described with reference to FIG. 9.

Figure 9:
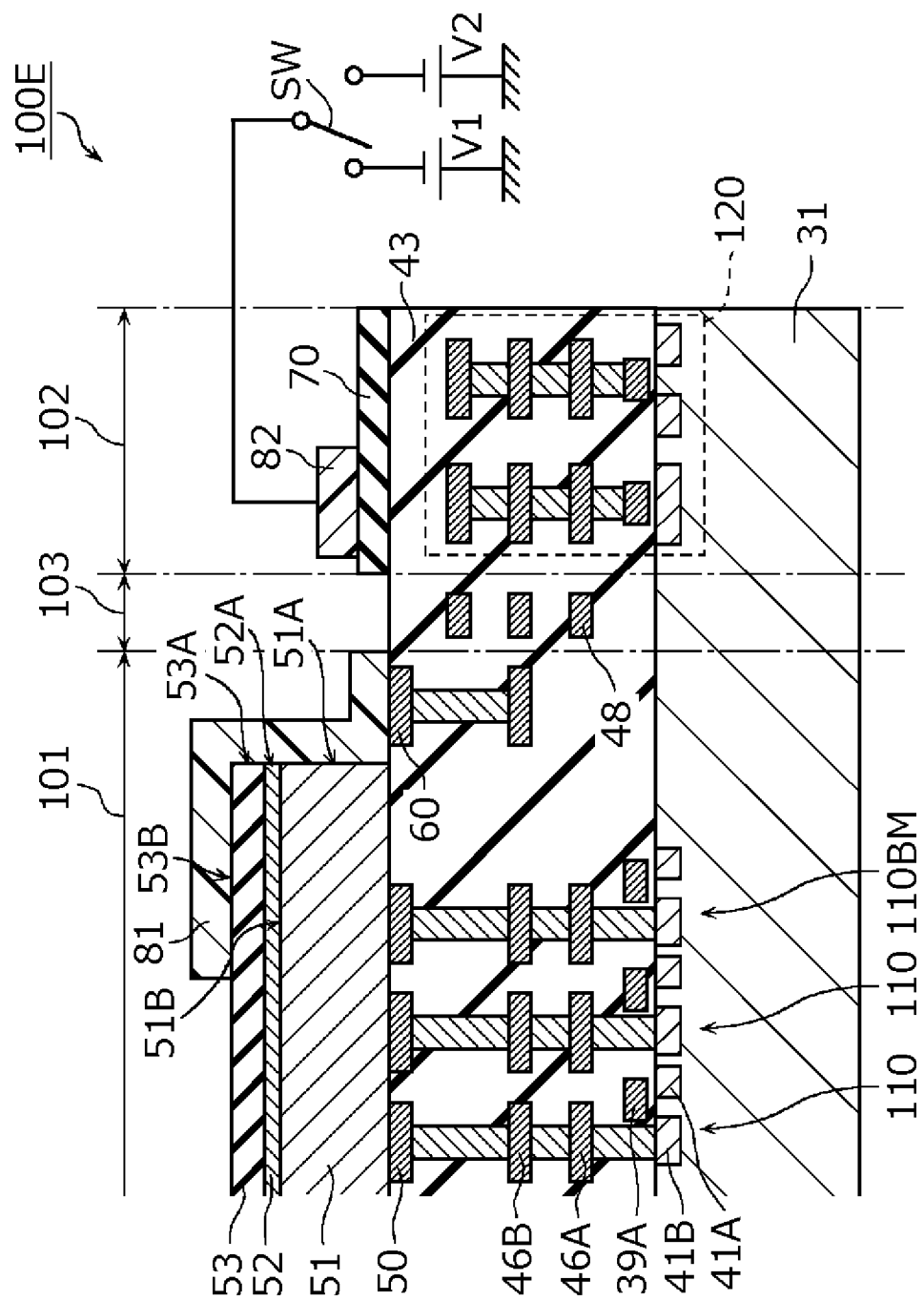
FIG. 9 is a sectional view of an imaging device according to a sixth embodiment.

FIG. 9 is a sectional view of an imaging device 100E according to the present embodiment. FIG. 9 illustrates a cross section corresponding to line IV-IV in FIG. 3, as in FIG. 4. Hereinafter, points that differ from the first embodiment will be mainly described, and descriptions of common points will be omitted or briefly given.

As illustrated in FIG. 9, an imaging device 100E has substantially the same structure as the structure of the imaging device 100 illustrated in FIG. 4. In the present embodiment, a variable voltage is applied to the second light-shielding film 82. The variable voltage includes two voltages V1 and V2, for example, as illustrated in FIG. 9. The two voltages V1 and V2 having different magnitudes are switched therebetween by a switch SW and are selectively applied to the second light-shielding film 82.

The variable voltage may include three or more voltages having different voltage values. For example, an operational amplifier may constantly apply a voltage that generally matches the potential of the vertical signal line 17 to the second light-shielding film 82. This allows the second light-shielding film 82 to serve as a guard electrode for suppressing or reducing fluctuation of the potential of the vertical signal line 17. This makes it possible to enhance the reliability of the imaging device 100E.

Other Embodiments

Although imaging devices according to one or more aspects have been described above in conjunction with some embodiments, the present disclosure is not limited to the embodiments. Modes obtained by making various modifications conceived by those skilled in the art to the embodiments and modes constructed by combining the constituent elements in different embodiments are also encompassed by the scope of the present disclosure, as long as such modes do not depart from the spirit of the present disclosure.

For example, in the third to sixth embodiments, the contact hole 53H may be provided, as in the second embodiment. Also, for example, in the fifth and sixth embodiments, the peripheral circuitry section 102 may include the spacer layer 91 and the transparent electrically conductive film 92, as in the fourth embodiment.

For example, the second light-shielding film 82 does not necessarily have to have an electrical conductivity property. That is, the second light-shielding film 82 may be formed using a material different from that of the first light-shielding film 81. For example, the second light-shielding film 82 may be formed using an insulating resin material. The second light-shielding film 82 may contain carbon black. The thickness of the second light-shielding film 82 and the thickness of the first light-shielding film 81 may be different from each other.

Also, for example, the first light-shielding film 81 does not necessarily have to be in contact with the end surface 51A of the photoelectric conversion film 51, the end surface 52A of the transparent electrode 52, and the end surface 53A of the insulating layer 53. For example, an insulating member may be provided between the first light-shielding film 81 and each of the end surfaces 51A, 52A, and 53A. When the first light-shielding film 81 is not in contact with the end surface 52A, the first light-shielding film 81 is in contact with the upper surface of the transparent electrode 52 via the contact hole 53H, as described above in the second embodiment.

Also, the insulating layer 53 may be slightly smaller than the transparent electrode 52 in plan view. With this arrangement, an end portion of the upper surface of the transparent electrode 52 is exposed, thereby making it possible to increase the area of contact with the first light-shielding film 81 and making it possible to reduce the contact resistance.

For example, the insulating layer 70 and the insulating layer 53 may be formed using different materials. Also, for example, the thickness of the insulating layer 70 and the thickness of the insulating layer 53 may be different from each other.

For example, the spacer layer 91 may be formed using a material different from the material of the photoelectric conversion film 51. In this case, the thickness of the spacer layer 91 and the thickness of the photoelectric conversion film 51 may be the same or may be different from each other.

Various changes, replacements, additions, omissions, and so on can also be made to each of the above-described embodiments within the scope of the appended claims or a scope equivalent thereto.

The present disclosure can be utilized for imaging devices in which circuit operations can be stabilized, and can be used for, for example, cameras or range finders.

What is claimed is:

1. An imaging device comprising:
a pixel section; and
a peripheral circuitry section provided around the pixel section, wherein:
the pixel section includes:
a photoelectric conversion film,
a top electrode located above the photoelectric conversion film, the top electrode having an upper surface, a lower surface and an end surface disposed between the upper surface and the lower surface,
bottom electrodes that face the top electrode, with the photoelectric conversion film being disposed between the top electrode and the bottom electrodes, and
a first light-shielding film that overlaps part of the photoelectric conversion film in a plan view and that is electrically connected to the top electrode, the first light-shielding film having electrical conductivity,
the peripheral circuitry section includes:
peripheral circuitry, and
a second light-shielding film that overlaps at least part of the peripheral circuitry in the plan view,
the first light-shielding film and the second light-shielding film are separated from each other, and
the first light-shielding film covers at least a part of the end surface of the top electrode.

2. The imaging device according to claim 1, wherein:
the peripheral circuitry section further includes a spacer layer that includes same material as material of the photoelectric conversion film and that overlaps at least part of the peripheral circuitry in the plan view, and
the second light-shielding film is located above the spacer layer.

3. The imaging device according to claim 2,
wherein a thickness of the photoelectric conversion film and a thickness of the spacer layer are same.

4. The imaging device according to claim 2,
wherein the peripheral circuitry section further includes an insulating layer located between the second light-shielding film and the spacer layer.

5. The imaging device according to claim 1, wherein:
the peripheral circuitry includes a sample-hold circuit, and
in the plan view, the second light-shielding film overlaps the sample-hold circuit.

6. The imaging device according to claim 1, wherein:
the peripheral circuitry includes a sample-hold circuit, and
in the plan view, the sample-hold circuit is not disposed between the first light-shielding film and the second light-shielding film.

7. The imaging device according to claim 1,
wherein material of the first light-shielding film is same as material of the second light-shielding film.

8. The imaging device according to claim 1, wherein:
the second light-shielding film has electrical conductivity, and
a constant voltage or a ground voltage is applied to the second light-shielding film.

9. The imaging device according to claim 1,
wherein a variable voltage is applied to the first light-shielding film.

10. The imaging device according to claim 1,
wherein a thickness of the first light-shielding film and a thickness of the second light-shielding film are same.

11. The imaging device according to claim 1,
wherein, in the plan view, a transistor is not disposed between the first light-shielding film and the second light-shielding film.

12. The imaging device according to claim 1,
wherein the pixel section further includes an insulating layer located between the first light-shielding film and the top electrode.

13. The imaging device according to claim 1,
wherein, in the plan view, the first light-shielding film does not overlap the peripheral circuitry.

14. The imaging device according to claim 1,
wherein, in the plan view, the first light-shielding film does not overlap the second light-shielding film.

15. The imaging device according to claim 1,
wherein, in the plan view, the first light-shielding film overlaps one or more of the bottom electrodes.

16. The imaging device according to claim 1,
wherein, in the plan view, the peripheral circuitry does not overlap the top electrode.

17. The imaging device according to claim 1,
wherein the top electrode comprises a transparent electrode.

18. The imaging device according to claim 1,
wherein the first light-shielding film has a frame shape.

19. The imaging device according to claim 18, wherein:
the second light-shielding film has a frame shape surrounding the first light-shielding film, and
the first light-shielding film and the second light-shielding film are separated from each other by a space having a frame shape.

20. The imaging device according to claim 1, wherein:
the photoelectric conversion film has an upper surface, a lower surface and an end surface disposed between the upper surface and the lower surface, and
the first light-shielding film covers at least a part of the end surface of the photoelectric conversion film.

21. An imaging device comprising:
a pixel section; and
a peripheral circuitry section provided around the pixel section, wherein:
the pixel section includes:
　a photoelectric conversion film,
　a top electrode located above the photoelectric conversion film,
　bottom electrodes that face the top electrode, with the photoelectric conversion film being disposed between the top electrode and the bottom electrodes, and
　a first light-shielding film that overlaps part of the photoelectric conversion film in a plan view and that is electrically connected to the top electrode, the first light-shielding film having electrical conductivity,
the peripheral circuitry section includes:
　peripheral circuitry, and
　a second light-shielding film that overlaps at least part of the peripheral circuitry in the plan view,
the first light-shielding film and the second light-shielding film are separated from each other, and
the first light-shielding film overlaps entire of a bottom electrode among the bottom electrodes in the plan view.

22. An imaging device comprising:
a pixel section; and
a peripheral circuitry section provided around the pixel section, wherein:
the pixel section includes:
　a photoelectric conversion film,
　a top electrode located above the photoelectric conversion film,
　bottom electrodes that face the top electrode, with the photoelectric conversion film being disposed between the top electrode and the bottom electrodes, and
　a first light-shielding film that overlaps part of the photoelectric conversion film in a plan view and that is electrically connected to the top electrode, the first light-shielding film having electrical conductivity,
the peripheral circuitry section includes:
　peripheral circuitry, and
　a second light-shielding film that overlaps at least part of the peripheral circuitry in the plan view and that has electrical conductivity, and
the first light-shielding film and the second light-shielding film are electrically insulated from each other.

* * * * *